(12) United States Patent
Leija et al.

(10) Patent No.: US 6,462,948 B1
(45) Date of Patent: Oct. 8, 2002

(54) THERMAL MANAGEMENT SYSTEM FOR A MULTIPLE PROCESSOR COMPUTER APPLIANCE

(75) Inventors: Javier Leija, Chandler; Mark D. Summers, Phoenix, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/887,069

(22) Filed: Jun. 25, 2001

(51) Int. Cl.[7] .................................................. H05K 7/20
(52) U.S. Cl. ........................ 361/697; 361/687; 361/690; 361/694; 361/695; 361/719; 361/720; 257/722; 174/16.1; 174/16.3; 165/80.3; 165/104.33; 165/185; 454/186
(58) Field of Search ................................. 361/690, 695, 361/704, 710, 715, 719–721; 257/721, 722; 174/16.1, 16.3; 165/80.2, 80.3, 104.33; 454/184

(56) References Cited

U.S. PATENT DOCUMENTS

| | | | |
|---|---|---|---|
| 5,535,094 A | * 7/1996 | Nelson et al. | ............... 361/697 |
| 5,592,363 A | * 1/1997 | Atarashi et al. | ............. 361/689 |
| 5,604,665 A | * 2/1997 | Chrysler et al. | ............. 361/703 |
| 5,912,802 A | * 6/1999 | Nelson | ......................... 361/695 |
| 5,946,188 A | * 8/1999 | Rochel et al. | ............... 361/690 |
| 6,019,165 A | * 2/2000 | Batchelder | .................. 165/80.3 |
| 6,072,397 A | * 6/2000 | Ostrowski | .................... 340/588 |
| 6,104,607 A | * 8/2000 | Behl | ........................... 361/687 |
| 6,236,565 B1 | * 5/2001 | Gordon | ....................... 361/695 |

* cited by examiner

*Primary Examiner*—Boris Chervinsky
(74) *Attorney, Agent, or Firm*—Antonelli, Terry, Stout & Kraus, LLP

(57) ABSTRACT

A system and method for cooling multiple microprocessors located on a circuit board containing disk drives, memory and other components. This cooling system and method utilizes a blower connected to an air duct. The air duct is divided into several channels via the placement of one or more walls within their duct. Each channel of the air duct is connected to a separate heat sink affixed to each microprocessor. Ambient air blown into the air duct is divided among the channels and proceeds to absorb heat from each of the heat sinks prior to being expelled from the circuit board. The system and method utilizes minimal space on the circuit board and provides maximum cooling for each microprocessor.

5 Claims, 5 Drawing Sheets

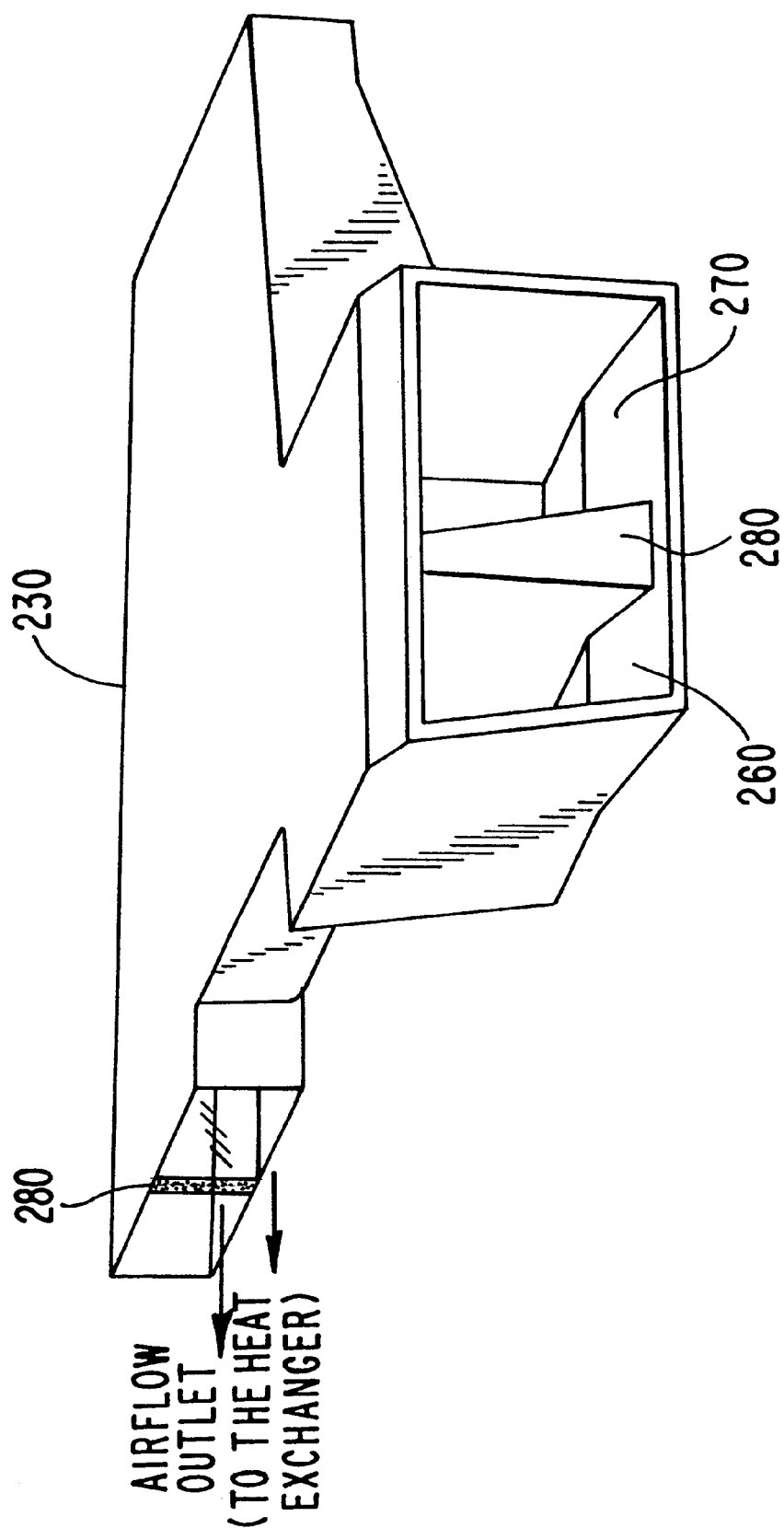

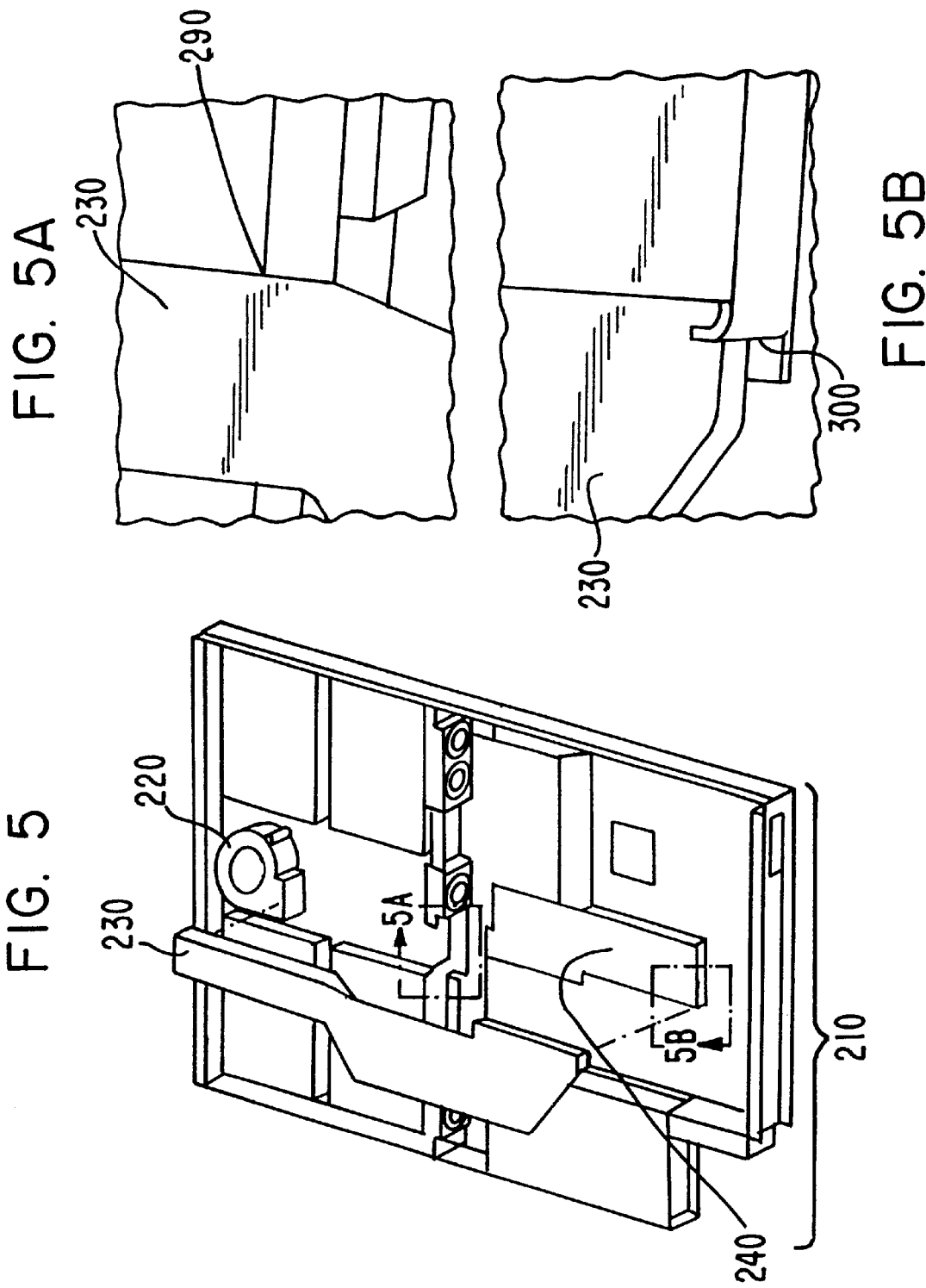

THERMAL MANAGEMENT SYSTEM FOR A MULTIPLE PROCESSOR COMPUTER APPLIANCE

FIELD

The invention relates to a thermal management system for a multiple processor computer appliance. More particularly, the present invention enables cool ambient air to absorb heat generated by multiple processors, or other electronic devices, without loss of cooling efficiency while minimizing the amount of space needed for the cooling system.

BACKGROUND

In the rapid development of computers many advancements have been seen in the areas of processor speed, throughput, communications, and fault tolerance. Initially computer systems were standalone devices in which a processor, memory and peripheral devices all communicated through a single bus. Later, in order to improve performance, several processors were interconnected to memory and peripherals using one or more buses. Today computer components have become so small that multiple high-performance processors, memory and disk drives, as well as other equipment, may all be placed on a single baseboard or circuit board. However, computer equipment in general and microprocessors in particular have always been susceptible to damage due to heat buildup.

Several methods have been employed for cooling high-performance microprocessors. A common method of cooling such microprocessors uses a fan heat sink in which an axial fan is attached to the heat sink atop the microprocessor in order to blow air across the heat sink to remove the heat dissipated by the microprocessor. However, these types of fan heat sinks are not that effective and generate their own sets of problems. First, they significantly increased the height of the baseboard or circuit board. Second, they are not effective cooling methods since the ambient air surrounding a microprocessor may be heated by surrounding components on the circuit board.

Another method of cooling high-performance microprocessors may be found in U.S. Pat. No. 5,912,802 to Nelson. FIG. 1 is a block diagram of the cooling system 100 as shown in the Nelson patent. The cooling system 100 has a blower 110, a first air duct 120, a first ducted heat sink 130, a second air duct 140, and a second ducted heat sink 150. The blower 110 brings in ambient air from air intake 135. The blower 110 forces air through the first air duct over the first ducted heat sink 130 which is attached to first microprocessor 160. The air moving over the first ducted heat sink 130 absorbs the dissipated heat from the first microprocessor 160 and continues through the second air duct 140. Thereafter, this warmer than ambient air passes through the second ducted heat sink 150 where it further absorbs heat dissipated from the second microprocessor 170.

It should be noted in the Nelson cooling system that the air ducts are connected in series and as the air passes over successive heat sinks attached to microprocessors it eventually would reach a temperature where cooling would be ineffective. The second microprocessor's heat sink receives pre-heated air from the first microprocessor's heat sink. Hence the second microprocessor would be inadequately cooled. In order for such a serial cooling system to handle several processors or extremely high-performance processors it is necessary to increase the size of blower 110 as well as the size of the air intake 135 and the first and second air ducts 120 and 130.

Therefore, what is required is a mechanism via which cool ambient air may be brought into contact with each heat exchanger for each microprocessor. This mechanism should not use air supplied to a microprocessor that has been pre-heated by a previous device. Further, the size of the blower as well as the air ducts should be kept to an absolute minimum so as to conserve power and space required by a computer appliance. Still further, the entire computer including processors, disk drives as well as the heat sinks and cooling system must fit within a 1U industry standard height which is 1.75 inches. In addition, this mechanism must be able to be adjusted so that depending upon the heat generated the appropriate volume of cooling air may be passed over the heat sink.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 4 is a hardware diagram of the air duct having an air flow inlet used in an embodiment of the present invention; and FIG. 5 is a hardware diagram of an embodiment of the present invention showing a removable air duct and slots in the air duct for assembly and disassembly.

DETAILED DESCRIPTION

Figure 1:
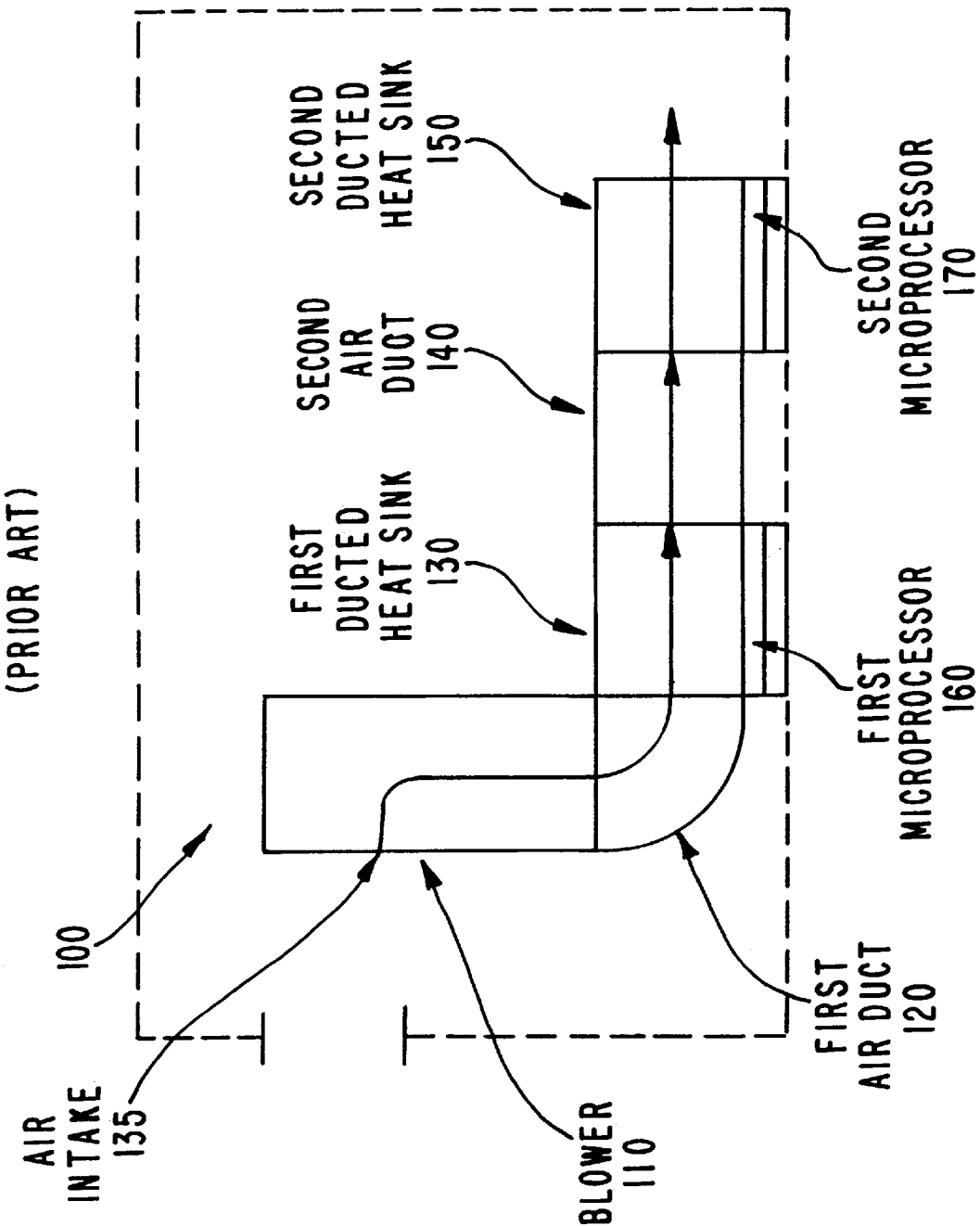
FIG. 1 is an example of the prior art in ducted cooling systems.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the FIGs. for simplicity of illustration and discussion, and so as not to obscure the invention.

Figure 2:
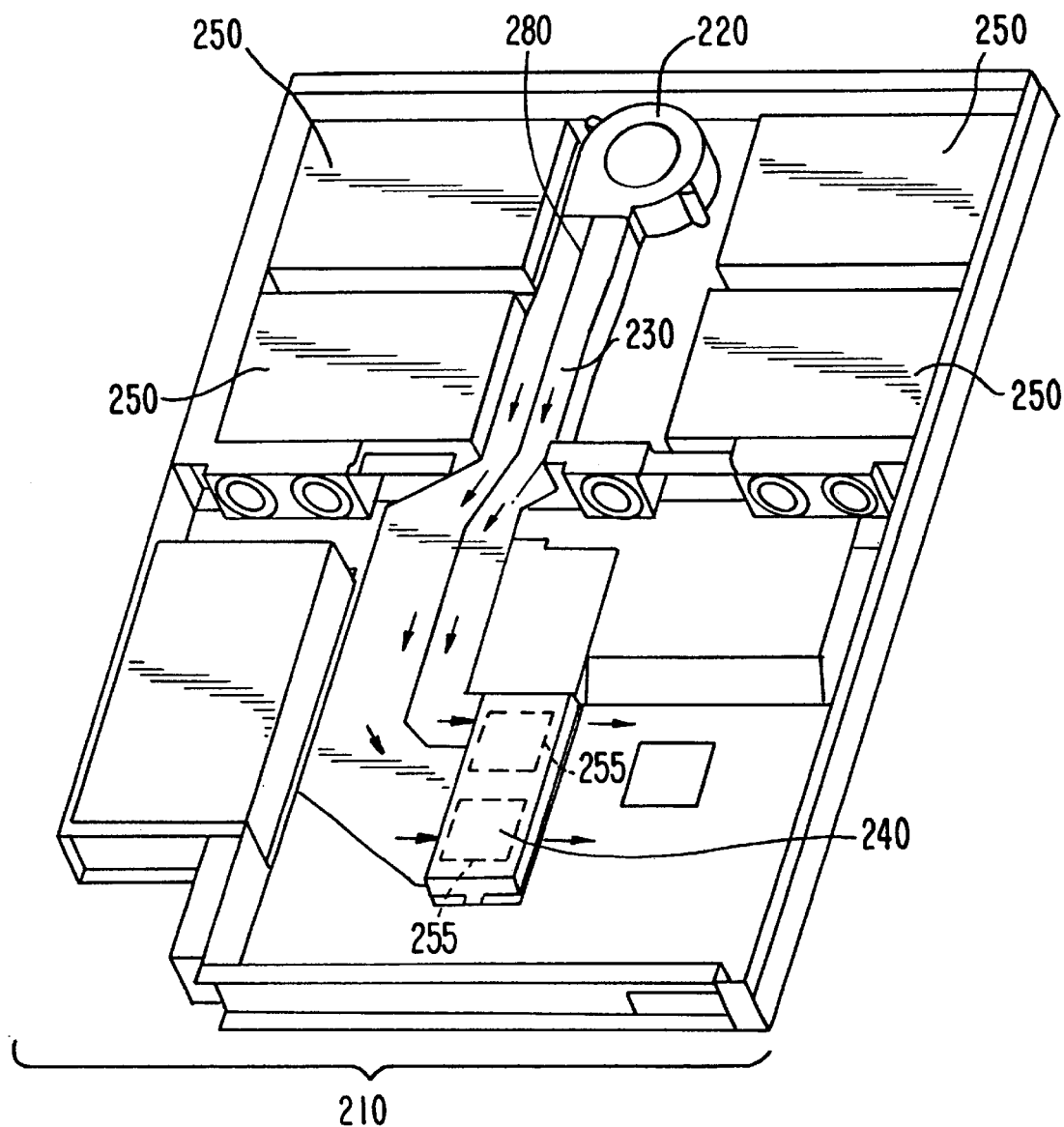
FIG. 2 is a hardware diagram of an embodiment of the present invention.

FIG. 2 is a hardware diagram of an embodiment of the present invention. Illustrated in FIG. 2 is a platform 210 having four disk drives 250 illustrated therein. As would be appreciated by one of ordinary skill in the art any number and type of peripherals, memory and other types of computer components may be placed within the platform 210. Also contained within the platform 210 is blower 220, air duct 230 and heat sink 240. It should be noted that blower 220 is located in a position in the platform 210 where it may acquire cool ambient air through an air inlet (not shown).

This platform 210 may be, but not limited to a computer or multiprocessor computer appliance. Further, this air inlet (not shown) may access ambient air outside the computer system entirely. The heat sink 240 may further comprise individual heat sinks for distinct and separate microprocessors. Any number of microprocessors with their associated heat sinks may be accommodated by the embodiments of the present invention.

Still referring to FIG. 2 the blower 220 is connected to the air duct 230 which may be, but not limited to, constructed of molded plastic. Further the air duct 230 is connected to heat sink 240 which may be, but not limited to, a finned 305 heat sink. This embodiment of the present invention operates by the blower 220 drawing in ambient air and forcing it through channels contained within air duct 230 to ensure that cool air is carried to the individual processors in a multiprocessor configuration. An adiabatic wall 280 separates the channels within the air duct 230 where the cool ambient air travels through the air duct 230 and over the heat sink 240, which is in thermal contact with the heat dissipating elements 255, such as high-performance microprocessors 255. It should be noted that any heat generating component 255 may be cooled using the embodiments of the present invention. Via the cooling air supplied by the blower 220 and air duct 230, the heat contained in heat sink 240 may be drawn off.

Figure 3:
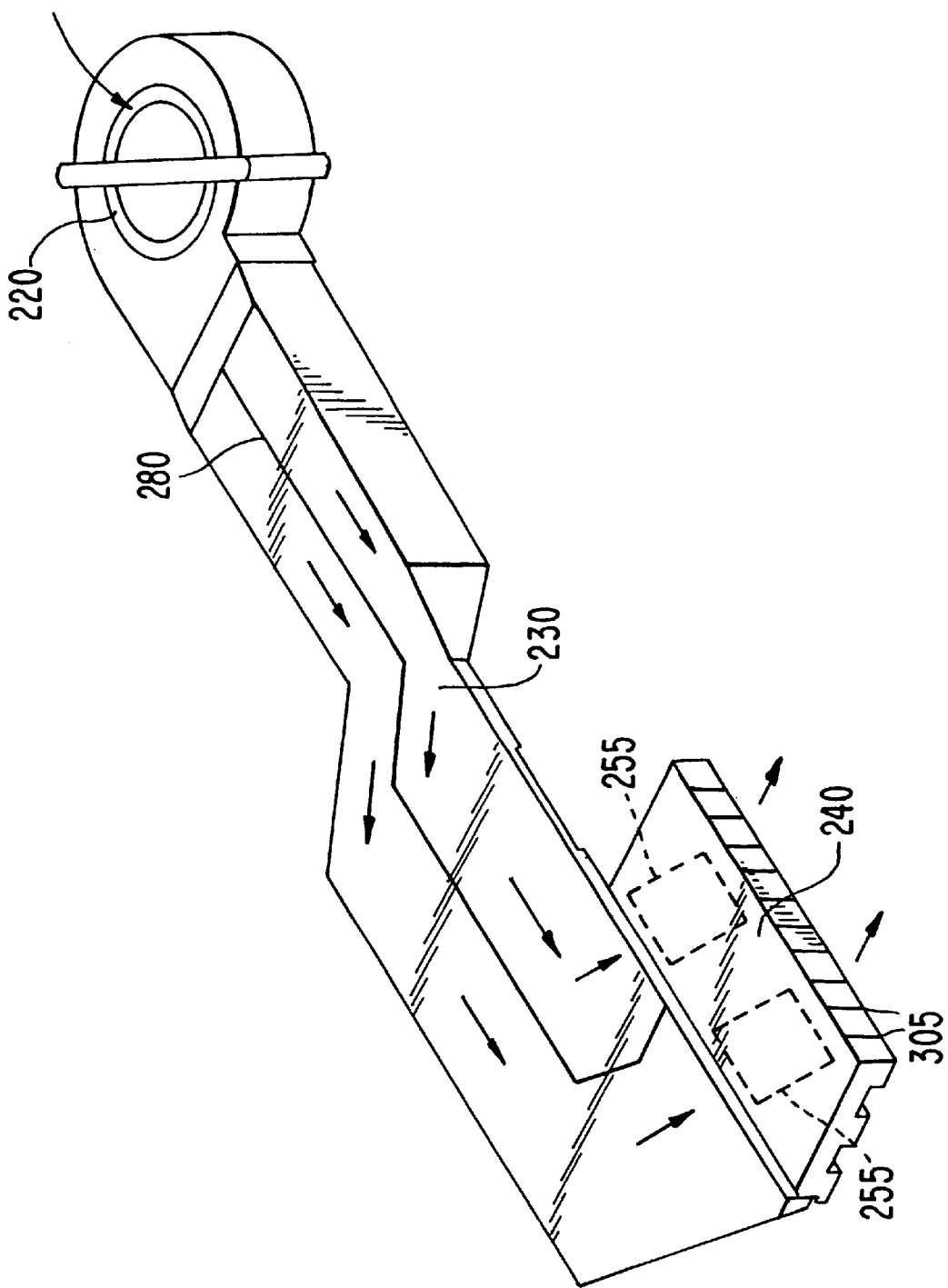
FIG. 3 is a hardware diagram of the blower fan, air duct and heat sink used in an embodiment of the present invention.

FIG. 3 is a hardware diagram of the blower fan 220, air duct 230 and heat sink 240 used in an embodiment of the present invention. As previously discussed the blower 220 connects to air duct 230 which in turn connects to heat sink 240. It should be noted that the blower 220 and the air duct 230 are separable for easy assembly and maintenance.

FIG. 4 is a hardware diagram of the air duct 230 having an air flow inlet used in an embodiment of the present invention. The air duct 230, as shown in FIG. 4, is illustrated with a first channel 260 and a second channel 270 separated by a wall 280. The separation of air duct 230 into separate channels is done between blower 220 and heat exchanger (sink) 240. As would be appreciated by one of ordinary skill in the art the air duct 230 may be divided into any number of channels by any number of walls 280 dependent upon the number of microprocessors and other devices that require cooling. Utilizing the wall 280 to separate the air flow down channel 260 and channel 270 it is possible to use a single blower 220 to cool multiple processors. It should be noted that the size of the channels may be adjusted to the requirements of the heat generating element. Thus, a component that generates more heat can have a larger channel and receive more cooling air.

FIG. 5 is a hardware diagram of an embodiment of the present invention showing a removable air duct 230 and a first slot 290 and a second slot 300 in the air duct 230 for assembly and disassembly. As shown in FIG. 5, the air duct 230 is removable from blower 220 and platform 210. This enables the air duct 230 to be easily installed and removed for maintenance. Further, slots 290 and 300 are provided in the air duct 230 for easy installation.

The benefit resulting from the present invention is that the entire cooling system may be packaged within a 1U standard size and therefore be extremely low-profile. Further, the channels 260 and 270 are adjustable to enable the appropriate airflow required by a particular heat dissipating element. In addition to the adjustable channels, channels in the duct can be modified to make certain that an equal amount of coolant air is directed over the individual processors. Further, in a multiprocessor configuration, each processors is insured that the coolant air is at the same temperature as received by all processors in the system. Therefore, since coolant air is dedicated to a single processor and is not reused to cool successive processors, the blower and air duct system may be kept to an absolute minimum size.

While we have shown and described only a few examples herein, it is understood that numerous changes and modifications as known to those skilled in the art could be made to the example embodiment of the present invention. For example, it is possible to place a sensor at each heat sink to determine when it is necessary to turn on the blower 220. In addition, it is possible to place a sensor at the outlet of the air duct after the air has passed over the heat sink 240 to determine whether additional power is required to the blower 220 in order to effectuate greater cooling. Therefore, we do not wish to be limited to the details shown and described herein, but intend to cover all such changes and modifications as are encompassed by the scope of the appended claims.

We claim:

1. A system for cooling a heat sink, comprising:
   a blower to blow ambient air; and
   an air duct connected to the blower and the heat sink, comprising:
      a plurality of channels formed by placing a wall in the air duct starting at the blower and extending to the heat sink, wherein said air duct is detachable and removable from the blower and heat sink and said air duct, blower and heat sink are less than 1.75 inches in thickness.

2. The system recited in claim 1, wherein the air inlet, blower, and air duct are contained within a platform.

3. The system recited in claim 2, wherein the platform is a computer or a multiprocessor computer appliance.

4. A system for cooling a plurality of microprocessors located in a platform, comprising:
   a plurality of heat sinks connected to the plurality of microprocessors;
   a blower to blow ambient air; and
   an air duct connected to the blower and each heat sink of the plurality of heat sinks, comprising:
      a plurality of channels formed by placing walls in the air duct starting at the blower and extending the entire length of the air duct to the plurality of heat sinks, said channels leading to a different heat sink to convey ambient air from the blower down a channel of the plurality of channels to each of the heat sinks, wherein said air duct is detachable and removable from the blower and heat sink and said air duct, blower and heat sink are less than 1.75 inches in thickness.

5. The system recited in claim 4, wherein the platform is a computer or a multiprocessor computer appliance.

* * * * *